United States Patent
Liu

(10) Patent No.: US 10,153,461 B1
(45) Date of Patent: Dec. 11, 2018

(54) DISPLAY PANEL AND METHOD FOR MANUFACTURING THE SAME

(71) Applicant: INT TECH CO., LTD., Hsinchu County (TW)

(72) Inventor: Yu-Chen Liu, Hsinchu County (TW)

(73) Assignee: INT TECH CO., LTD., Hsinchu County (TW)

( * ) Notice: Subject to any disclaimer, the term of this patent is extended or adjusted under 35 U.S.C. 154(b) by 0 days.

(21) Appl. No.: 15/703,449

(22) Filed: Sep. 13, 2017

(51) Int. Cl.
  *H01L 51/52* (2006.01)
  *H01L 27/32* (2006.01)
  *H01L 51/56* (2006.01)

(52) U.S. Cl.
  CPC ........ *H01L 51/5281* (2013.01); *H01L 27/323* (2013.01); *H01L 27/3232* (2013.01); *H01L 51/56* (2013.01)

(58) Field of Classification Search
  None
  See application file for complete search history.

(56) References Cited

U.S. PATENT DOCUMENTS

| | | | | |
|---|---|---|---|---|
| 8,723,768 B2* | 5/2014 | Egi | ........................ | C09K 11/06 345/84 |
| 2008/0042926 A1* | 2/2008 | Egi | ........................ | C09K 11/06 345/32 |
| 2008/0074859 A1* | 3/2008 | Kitayama | .............. | G02B 5/045 362/19 |
| 2013/0182328 A1* | 7/2013 | Stewart | .................. | G02B 1/118 359/580 |
| 2014/0326956 A1 | 11/2014 | Wang et al. | | |
| 2015/0241603 A1* | 8/2015 | Fujii | ...................... | G02B 1/118 359/601 |
| 2016/0172631 A1* | 6/2016 | Yamada | .............. | H01L 51/5275 428/156 |
| 2017/0212384 A1* | 7/2017 | Chen | .................. | G02F 1/13338 |
| 2017/0317315 A1* | 11/2017 | Yang | .................. | H01L 51/5281 |
| 2017/0373270 A1* | 12/2017 | Kim | ...................... | H01L 27/323 |
| 2018/0095303 A1* | 4/2018 | Cho | ..................... | G02B 5/3066 |
| 2018/0182816 A1* | 6/2018 | Kang | .................... | H01L 27/323 |

FOREIGN PATENT DOCUMENTS

| | | |
|---|---|---|
| TW | 200844475 A | 11/2008 |
| TW | 201120472 A | 6/2011 |

OTHER PUBLICATIONS

Office Action and Search Report dated Aug. 22, 2018 issued by the Taiwan Intellectual Property Office (TIPO) for counterpart application No. 106139711.
English Translated Summary of Office Action and Search Report dated Aug. 22, 2018 issued by the Taiwan Intellectual Property Office (TIPO) for counterpart application No. 106139711.

* cited by examiner

*Primary Examiner* — Joseph Schoenholtz
(74) *Attorney, Agent, or Firm* — WPAT, P.C., Intellectual Property Attorneys; Anthony King

(57) ABSTRACT

A display panel includes a display device, a first anti-reflection layer and a cover layer. The first anti-reflection layer is disposed over the display device, wherein the first anti-reflection layer comprises a first structural layer including a plurality of first protrusion structures opposite to the display device. The cover layer is disposed over the first anti-reflection layer.

14 Claims, 15 Drawing Sheets

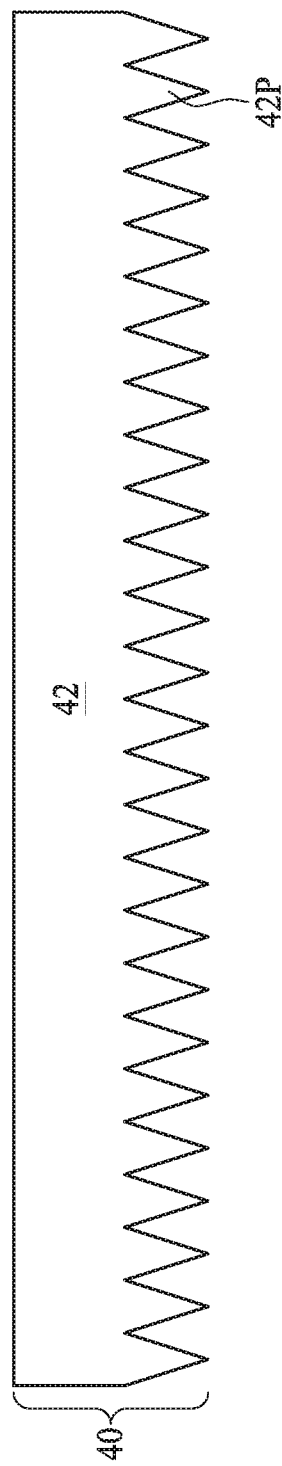

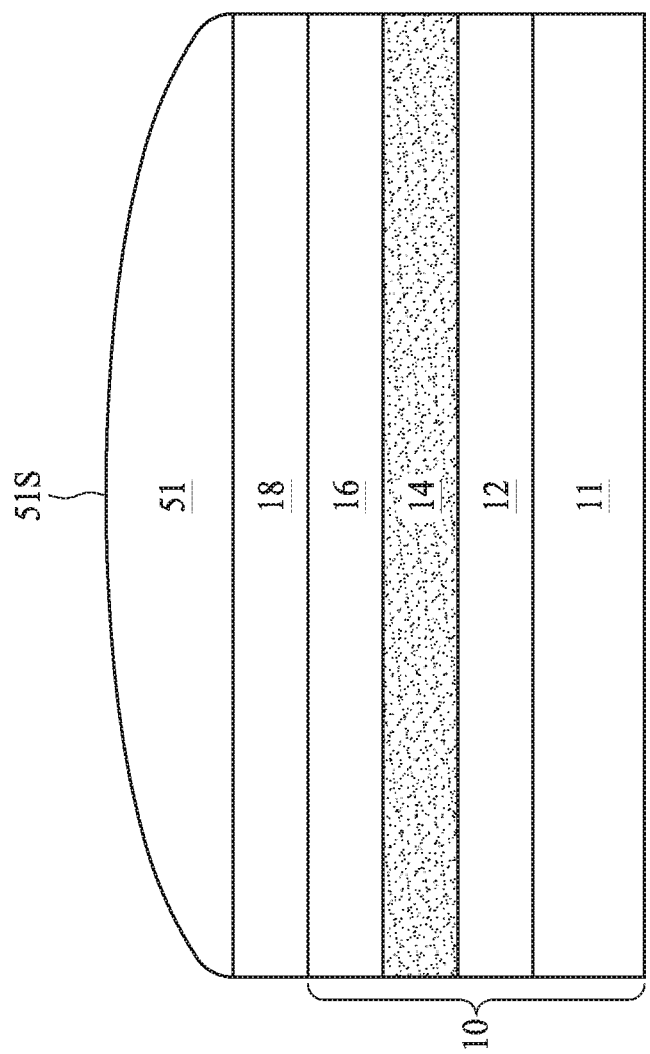

DISPLAY PANEL AND METHOD FOR MANUFACTURING THE SAME

BACKGROUND

A display panel such as an organic light-emitting diode (OLED) display panel has been incorporated in various electronic devices such as smart phones to provide display function. The display panel, however, is suffered from ambient light reflection in outdoor use, which deteriorates visibility of the display panel.

SUMMARY

Embodiments of the present invention provide a display panel comprising a display device, a first anti-reflection layer and a cover layer. The first anti-reflection layer is disposed over the display device, wherein the first anti-reflection layer comprises a first structural layer including a plurality of first protrusion structures opposite to the display device. The cover layer is disposed over the first anti-reflection layer.

In some embodiments, the display device comprises an organic light-emitting diode (OLED) device comprising an anode, an organic light-emitting layer over the anode, and a cathode over the organic light-emitting layer.

In some embodiments, the first anti-reflection further comprises a first optical layer in contact with the first structural layer, and a surface of the first optical layer is engaged with the first protrusion structures.

In some embodiments, a refractive index of the first optical layer is smaller than a refractive index of the first structural layer.

In some embodiments, the display panel further comprises a thin film encapsulation between the display device and the first anti-reflection layer.

In some embodiments, the display panel further comprises a touch input device between the thin film encapsulation and the cover layer.

In some embodiments, the display panel further comprises a polarizer between the touch input device and the cover layer.

In some embodiments, the display panel further comprises a second anti-reflection layer between the first anti-reflection layer and the cover layer, wherein the second anti-reflection layer comprises a second structural layer including a plurality of second protrusion structures facing the first anti-reflection layer.

In some embodiments, the second anti-reflection layer further comprises a second optical layer in contact with the second structural layer, and a surface of the second optical layer is engaged with the second protrusion structures.

In some embodiments, a refractive index of the second optical layer is smaller than a refractive index of the second structural layer.

Embodiments of the present invention provide a display penal including an organic light-emitting diode (OLED) device and a first anti-reflection layer. The OLED device comprises a plurality of pixels for emitting lights, wherein each of the pixels comprises an anode, an organic light-emitting layer over the anode, and a cathode over the organic light-emitting layer. The first anti-reflection layer is over the cathodes of the pixels of the OLED device, wherein the first anti-reflection layer is configured to inhibit reflection of incident lights and to pass the lights emitted from the pixels, and a transmittance of the first anti-reflection layer for the lights emitted from the pixels is greater than 50%.

In some embodiments, the first anti-reflection layer comprises a first structural layer including a plurality of first protrusion structures opposite to the OLED device.

In some embodiments, the first anti-reflection further comprises a first optical layer in contact with the first structural layer, and a surface of the first optical layer is engaged with the first protrusion structures.

In some embodiments, a refractive index of the first optical layer is smaller than a refractive index of the first structural layer.

In some embodiments, the display panel further includes a second anti-reflection layer over the first anti-reflection layer, wherein the second anti-reflection layer is configured to inhibit reflection of incident lights and to pass the lights emitted from the pixels, and a transmittance of the second anti-reflection layer for the lights emitted from the pixels is greater than 50%.

In some embodiments, the second anti-reflection layer comprises a second structural layer including a plurality of second protrusion structures facing the first anti-reflection layer.

In some embodiments, the second anti-reflection layer further comprises a second optical layer in contact with the second structural layer, and a surface of the second optical layer is engaged with the second protrusion structures.

In some embodiments, a refractive index of the second optical layer is smaller than a refractive index of the second structural layer.

Embodiments of the present invention provide a method for manufacturing a display panel. The method comprises forming a display device, forming a photo-sensitive material over the display device, and imprinting a plurality of protrusion structures in a surface of the photo-sensitive material with a mold. The method further comprises optically irradiating the photo-sensitive material, and removing the mold from the photo-sensitive material to form an anti-reflection layer having the plurality of protrusion structures.

In some embodiments, the method further comprises forming an optical layer over the anti-reflection layer, wherein the optical layer is contact with the anti-reflection layer and engaged with the protrusion structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a schematic diagram of a second anti-reflection layer in accordance with some embodiments of the present disclosure.

FIG. 7A, FIG. 7B, FIG. 7C, FIG. 7D and FIG. 7E are schematic diagrams illustrating a method for forming a display panel in accordance with some embodiments of the present disclosure.

DETAILED DESCRIPTION

Figure 1:
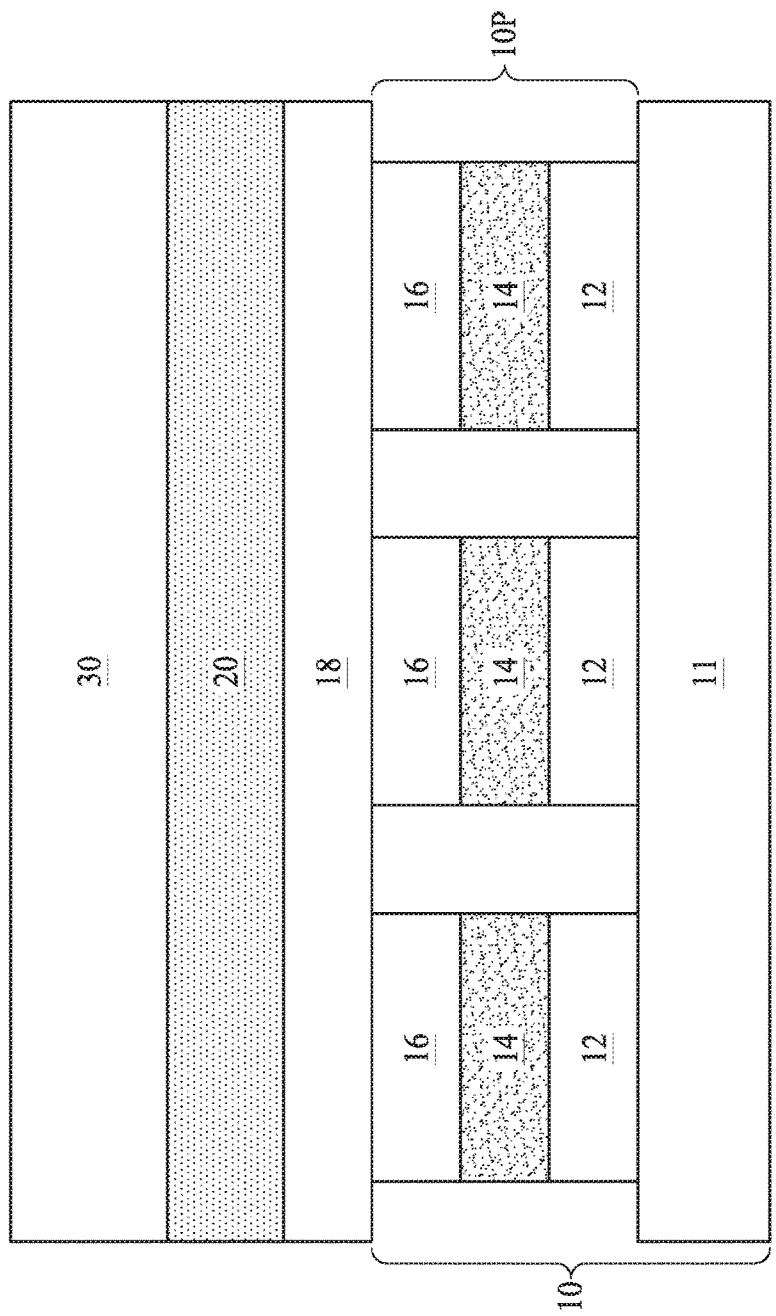
FIG. 1 is a schematic diagram of a display panel in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

Further, spatially relative terms, such as "beneath," "below," "lower," "above," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

In some embodiments of the present disclosure, a display panel with anti-reflection effect is provided. The display panel includes one or more anti-reflection layer for reducing reflection of ambient light, so that the contrast ratio of the display panel in outdoor environment is improved. The anti-reflection layer may allow more than 50% of light provided by the display panel to pass through, such that the brightness of the display panel is not seriously affected by the anti-reflection layer. In some embodiments, the anti-reflection layer may include two optical layers with different indices of refraction, and the two optical layers may have complementary patterns engaged with each other. The anti-reflection layer can diffract incident ambient light and thus reduces reflection of incident ambient light. In some embodiments, the display panel is an electroluminescent display panel such as an organic light-emitting diode (OLED) display panel. In some embodiments, the display panel may include a flexible display panel or a bendable display panel. The anti-reflection layer may be integrally and directly formed over the display surface of the display panel without damaging the display panel. The anti-reflection layer may be formed form extendable material so that it can be expended when the display panel is bent or folded. By way of example, the anti-reflection layer may be formed by imprinting process. In contrast to an anti-reflection layer attaching to the surface of the display panel, the integrally-formed anti-reflection layer can save use of additional adhesive film, reduce manufacturing costs and minimize the overall thickness of the display panel.

FIG. 1 is a schematic diagram of a display panel in accordance with some embodiments of the present disclosure. As shown in FIG. 1, the display panel 1 includes a display device 10, a first anti-reflection layer 20 and a cover layer 30. In some embodiments, the display panel 1 may include an electroluminescent display panel such as an OLED display panel. In some embodiments, the display device 10 may include a plurality of pixels 10P formed over a substrate 11. The substrate 11 may include a rigid substrate such as a glass substrate, or a flexible substrate such as a plastic substrate. In some embodiments, circuitries such as driving circuits may be formed on the substrate 10. Each of the pixels 10P may include an anode 12, an organic light-emitting layer 14 and a cathode 16. The anode 12 may be formed over the substrate 11, and electrically connected to the driving circuits. The organic light-emitting layer 14 may be formed over the anode 12. The cathode 16 may be formed over the organic light-emitting layer 14, and electrically connected to the driving circuits. In some embodiments, the anodes 12, the organic light-emitting layers 14 and the cathodes 16 may be formed on the substrate 11 by deposition, photolithography and etching techniques, and thus the resolution of the display device 10 can be increased. The anode 12 and the cathode 16 may be formed from transparent conductive material such as indium tin oxide (ITO) or thin metal material. In some embodiments, the display device 10 may include a flexible display device or a bendable display panel. In such a case, the anode 12 and the cathode 16 may be formed from conductive material with good ductility and malleability such as thin metal.

The first anti-reflection layer 20 is disposed over the display device 10, and configured to inhibit reflection of incident ambient light and to pass the lights emitted from the pixels 10P, so that the contrast ratio of the display panel 1 in outdoor environment is improved. In some embodiments, the transmittance of the first anti-reflection layer 20 for the lights emitted from the pixels 10P is greater than 50%, greater than 60%, greater than 70%, greater than 80% or even higher. In some embodiments, the first anti-reflection layer 20 may be integrally formed over the display device 10 without requiring additional adhesive layer. The first anti-reflection layer 20 may be formed from transparent material having extendable ability such that the first anti-reflection layer 20 and underlying layer may have good adhesion when the display panel 1 is bent or folded. The cover layer 30 is disposed over the first anti-reflection layer 20. The cover layer 30 is configured as a protection layer to protect the display panel 1. In some embodiments, the cover layer 30 may include a plastic layer, but is not limited thereto.

In some embodiments, the display panel 1 may further include a thin film encapsulation (TFE) 18 disposed between the display device 10 and the first anti-reflection layer 20. The TFE 18 is configured to encapsulate the display device 10 from being exposed to moisture, oxygen or the like, such that the lifetime of the display panel 1 can be extended. In some embodiments, the TFE 18 may be a single-layered encapsulation formed from organic material or inorganic material. In some embodiments, the TFE 18 may be a multi-layered encapsulation formed from organic material and inorganic material stacked to one another. For example, the TFE 18 may include two inorganic films and one organic film sandwiched between the inorganic films.

In some alternative embodiments, other functional layer(s) configured to provide other functions may be integrated into the display panel 1.

Figure 1A:
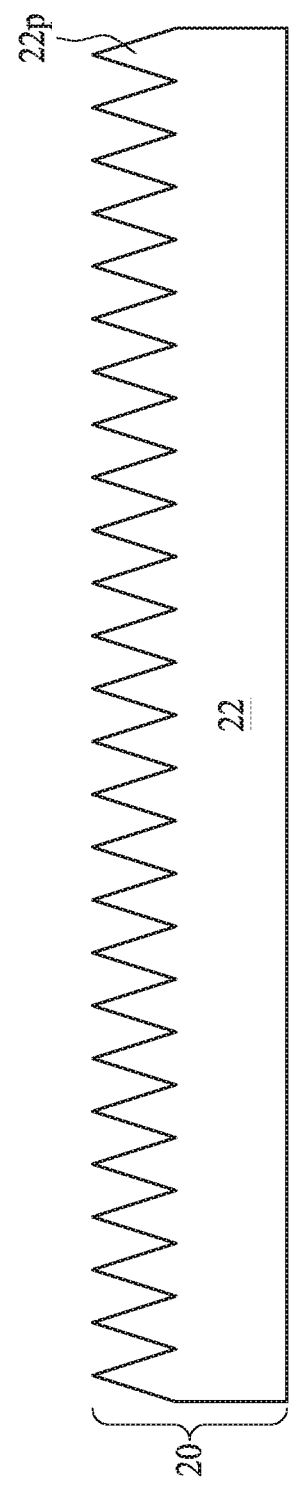
FIG. 1A is a schematic diagram of a first anti-reflection layer in accordance with some embodiments of the present disclosure.

FIG. 1A is a schematic diagram of a first anti-reflection layer in accordance with some embodiments of the present disclosure. As shown in FIG. 1 and FIG. 1A, the first anti-reflection layer 20 may include a first structural layer 22. In some embodiments, the first structural layer 22 includes a plurality of first protrusion structures 22P opposite to the display device 10. By way of example, the first protrusion structures 22P may include moth-eye structures protruding out from the first structural layer 22, and recessed structures such as valleys may be formed between adjacent moth-eye structures. In some embodiments, the refractive index of the first structural layer 22 is different from the refractive index of a medium interfacing the first structural layer 22. In some embodiments, the refractive index of the first structural layer 22 is greater than the refractive index of a medium. By way of example, the medium may include a gaseous medium such as air having a refractive index of about 1, and the first structural layer 22 may be formed from a transparent material such as organic or inorganic material having a refractive index of about 1.5, but is not limited thereto.

Figure 1B:
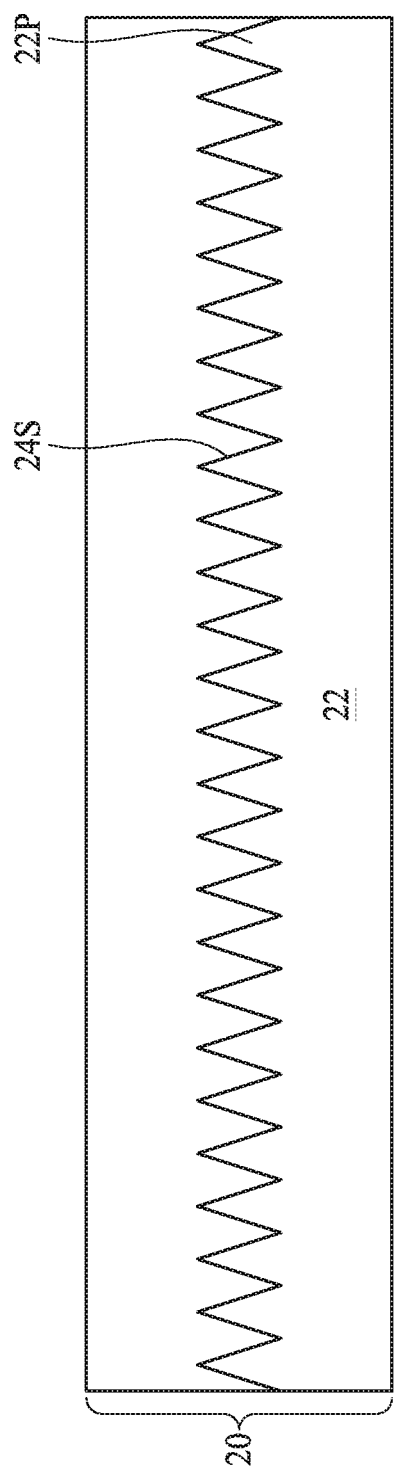
FIG. 1B is a schematic diagram of a first anti-reflection layer in accordance with some embodiments of the present disclosure.

FIG. 1B is a schematic diagram of a first anti-reflection layer in accordance with some embodiments of the present disclosure. As shown in FIG. 1B, the first anti-reflection layer 20 may further include a first optical layer 24 disposed over the first structural layer 22. In some embodiments, the first optical layer 24 is in contact with the first structural layer 22, and a surface 24S of the first optical layer 24 is engaged with the first protrusion structures 22P of the first structural layer 22. In some embodiments, the first structural layer 22 and the first optical layer 24 are formed from transparent materials such as organic or inorganic materials having different refractive indices. In some embodiments, the refractive index of the first optical layer 24 is smaller than the refractive index of the first structural layer 22. By way of example, the refractive index of the first optical layer 24 is about 1, and the refractive index of the first structural layer 22 is about 1.5, but not limited thereto.

In some embodiments of the present disclosure, the display panel 1 includes an integrally-formed anti-reflection layer. The anti-reflection layer includes protrusion structures and recess structures having different refractive indices such that the effective refractive index of the anti-reflection layer varies in a depth direction. In some embodiments, the effective refractive index of the anti-reflection layer varies continuously in the depth direction. In some embodiments, the effective refractive index of the anti-reflection layer varies discretely in the depth direction. Accordingly, reflection of incident ambient light can be reduced. Compared to a polarizer type anti-reflection structure attached to the display panel with adhesive layer, the integrally-formed anti-reflection layer may not require additional adhesive layer and thus has thinner thickness. In addition, in contrast to a polarizer type anti-reflection structure, the transmittance of the integrally-formed anti-reflection layer for the lights emitted from the pixels is higher than that of a polarizer type anti-reflection structure, and thus the brightness of display image can be improved.

The display panel of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 2:
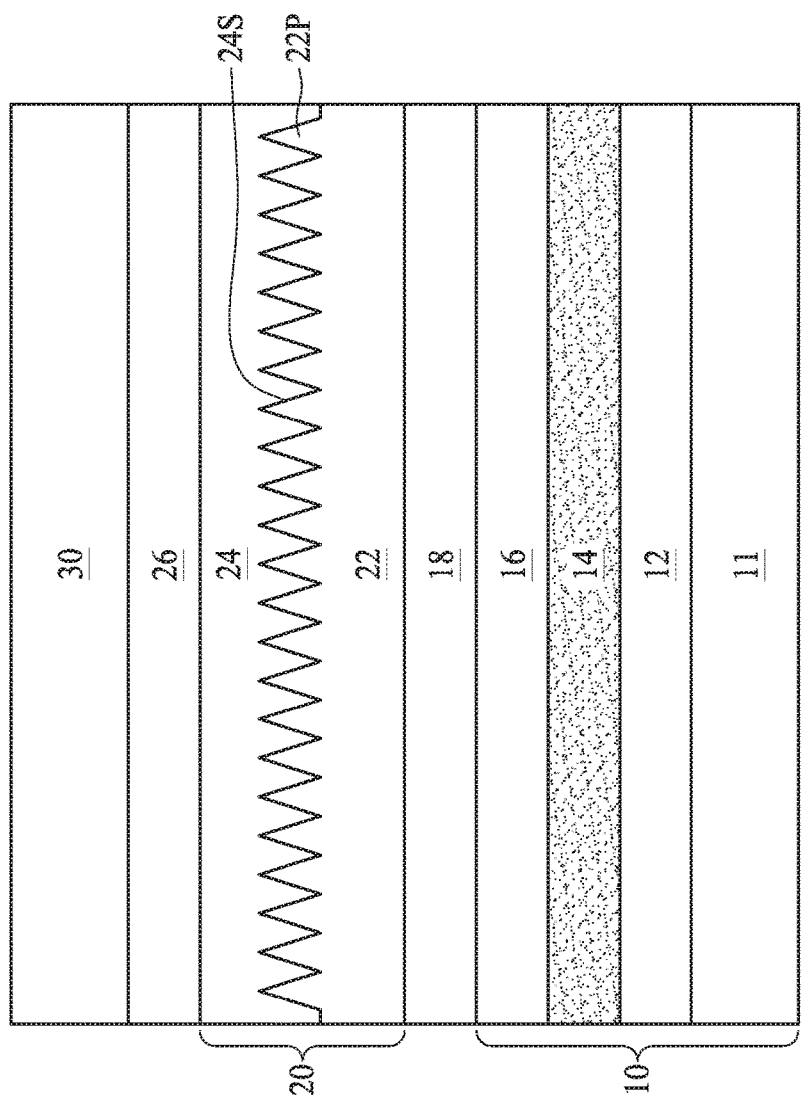
FIG. 2 is a schematic diagram of a display panel in accordance with some embodiments of the present disclosure.

FIG. 2 is a schematic diagram of a display panel in accordance with some embodiments of the present disclosure. As shown in FIG. 2, in contrast to the display panel 1 of FIG. 1, the display panel 2 further includes a touch input device 26 configured to provide touch input function. In some embodiments, the touch input device 26 may be disposed between the TFE 18 and the cover layer 30. In some embodiments, the touch input device 26 may be disposed between the first anti-reflection layer 20 and the cover layer 30, but not limited thereto. In some embodiments, the touch input device 26 may be integrally formed over the first anti-reflection layer 20. In some embodiments, the touch input device 26 may include a capacitive touch input device or other types of touch input device.

Figure 3:
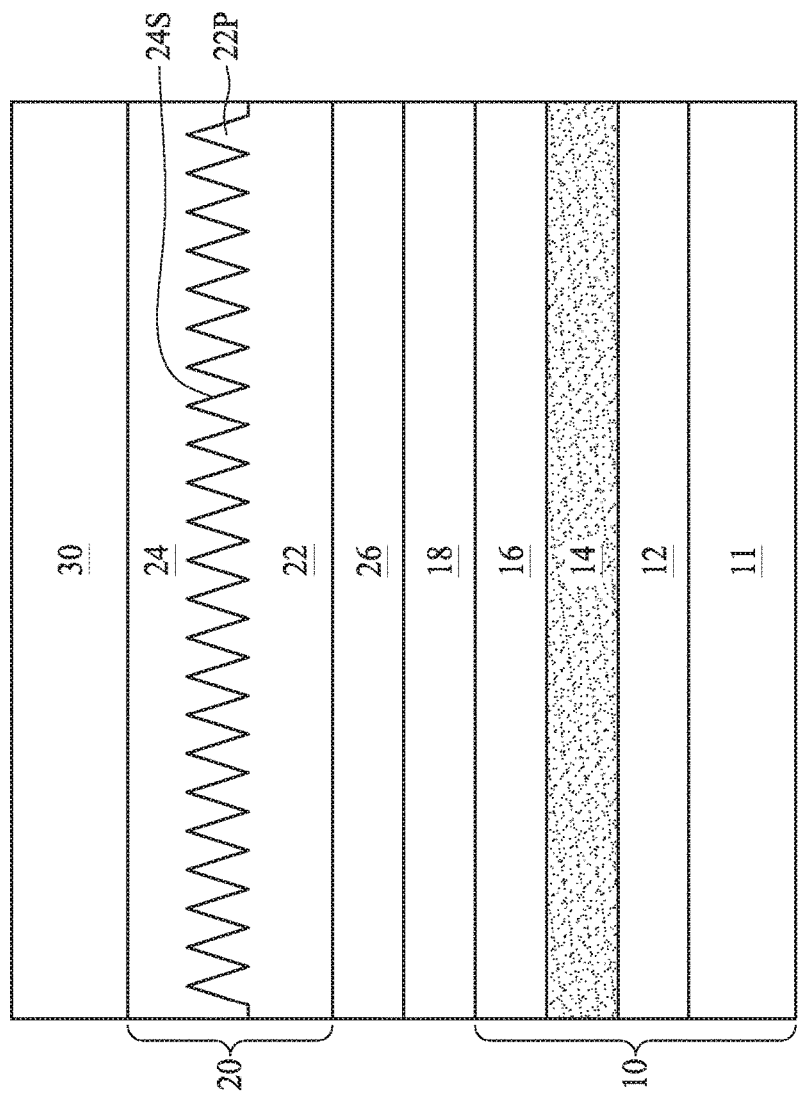
FIG. 3 is a schematic diagram of a display panel in accordance with some embodiments of the present disclosure.

FIG. 3 is a schematic diagram of a display panel in accordance with some embodiments of the present disclosure. As shown in FIG. 3, in contrast to the display panel 2 of FIG. 2, the first anti-reflection layer 20 of the display panel 3 is disposed between the touch input device 26 and the cover layer 30. The first anti-reflection layer 20 is proximal to the cover layer 30 than the touch input device 26, and thus reflection of incident ambient light can be inhibited in advance before entering the touch input device 26. Accordingly, the anti-reflection effect can be further enhanced.

Figure 4:
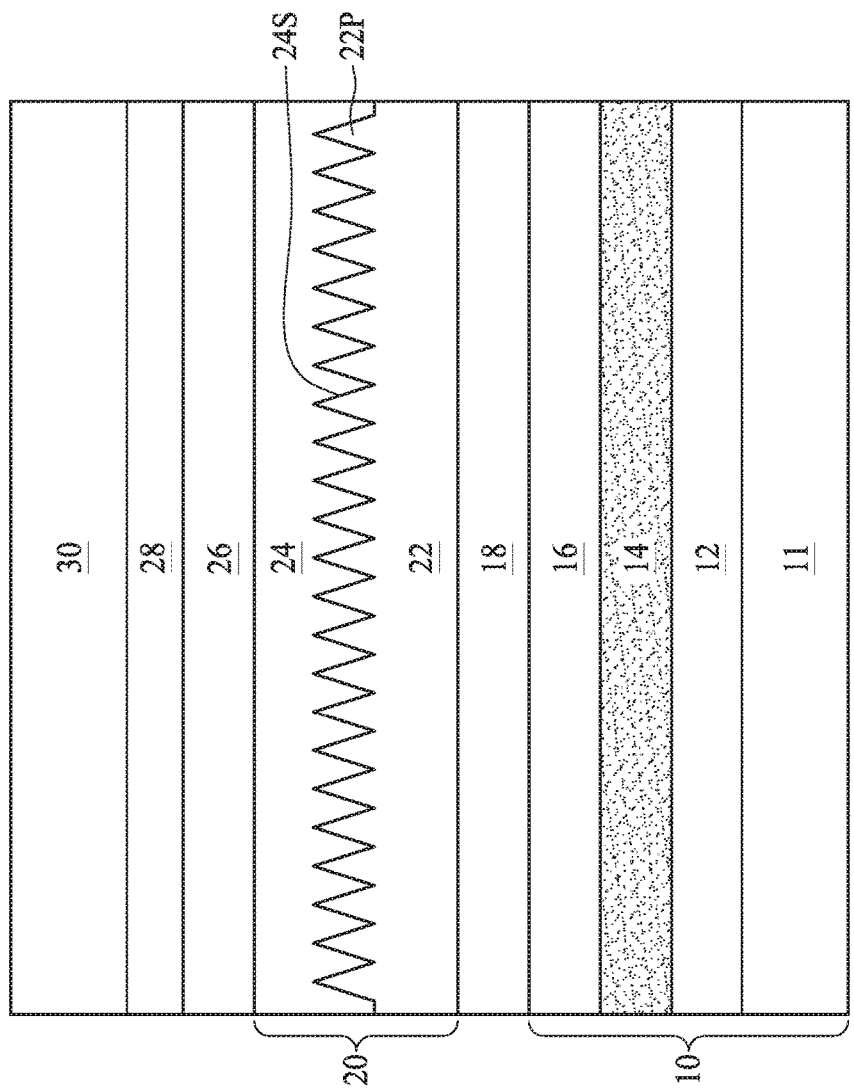
FIG. 4 is a schematic diagram of a display panel in accordance with some embodiments of the present disclosure.

FIG. 4 is a schematic diagram of a display panel in accordance with some embodiments of the present disclosure. As shown in FIG. 4, in contrast to the display panel 2 of FIG. 2, the display panel 4 further includes a polarizer 28 configured to preliminarily reduce reflection of incident light. In some embodiments, the polarizer 28 is disposed between the touch input device 26 and the cover layer 30. In some embodiments, the polarizer 28 may be integrally formed over the touch input device 26. In some embodiments, the polarizer 28 may include a stack of a circular polarizing layer and a linear polarizing layer. In some embodiments, the circular polarizing layer is configured as a ¼ wavelength retardation layer.

Figure 5:
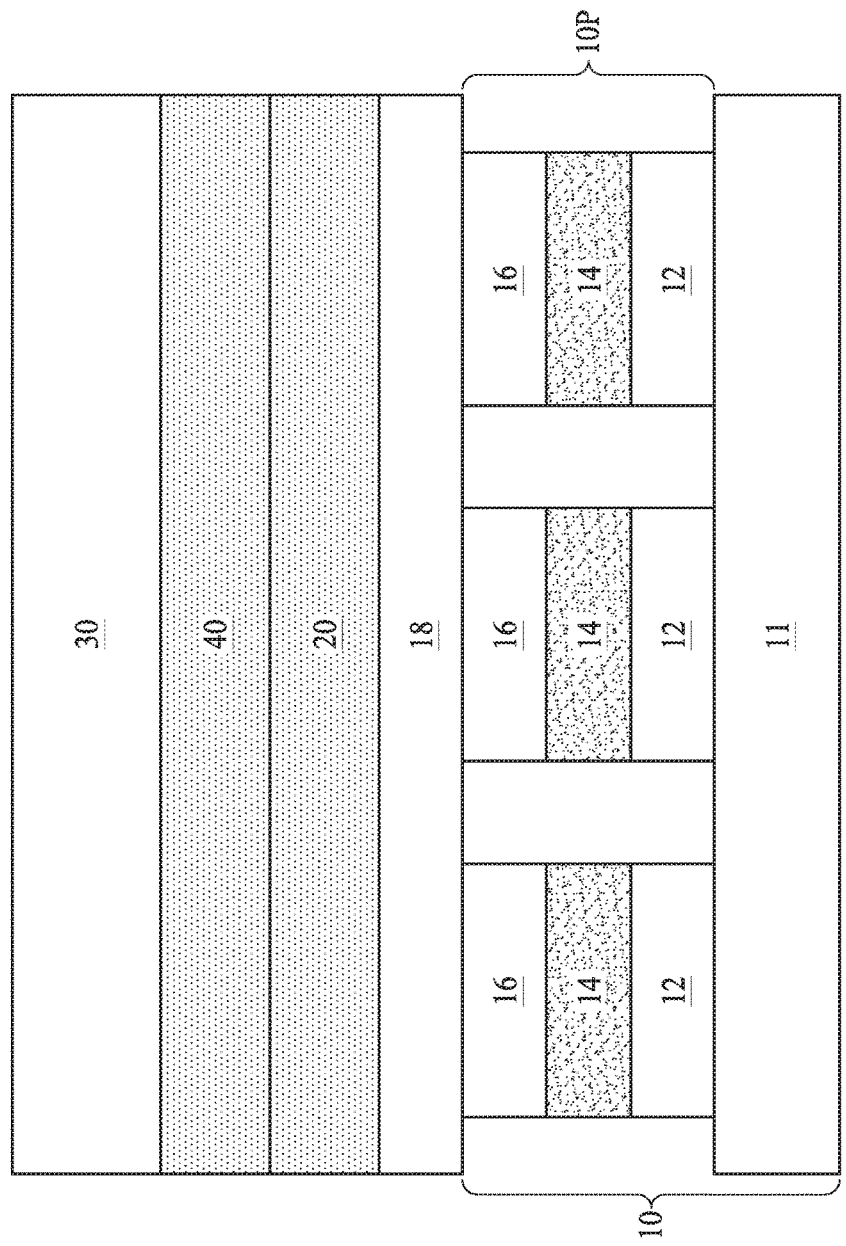
FIG. 5 is a schematic diagram of a display panel in accordance with some embodiments of the present disclosure.

FIG. 5 is a schematic diagram of a display panel in accordance with some embodiments of the present disclosure. As shown in FIG. 5, in contrast to the display panel 1 of FIG. 1, the display panel 5 further includes a second anti-reflection layer 40 disposed between the first anti-reflection layer 20 and the cover layer 30. The second anti-reflection layer 40 is configured to inhibit reflection of incident ambient light and to pass the lights emitted from the pixels 10P, so that the contrast ratio of the display panel 5 in outdoor environment is improved. In some embodiments, the transmittance of the second anti-reflection layer 40 for the lights emitted from the pixels 10P is greater than 50%, greater than 60%, greater than 70%, greater than 80% or even higher. The first anti-reflection layer 20 in conjunction with the second anti-reflection layer 40 may further enhance reflection of incident ambient light, so that the contrast ratio of the display panel 5 in outdoor environment can be further improved. In some embodiments, the first anti-reflection layer 20 and the second anti-reflection layer 40 may be both integrally formed over the display device 10.

In some embodiments, the first anti-reflection layer 20 may include the first structural layer 22 having first protrusion structures 22P facing the cover layer 30 as illustrated in FIG. 1A. In some embodiments, the first anti-reflection layer 20 may include the first structural layer 22 having first protrusion structures 22P facing the cover layer 30, and the first optical layer 24 interfacing the first structural layer 22 as illustrated in FIG. 1B.

FIG. 5A is a schematic diagram of a second anti-reflection layer in accordance with some embodiments of the present disclosure. As shown in FIG. 5 and FIG. 5A, the second anti-reflection layer 40 may include a second structural layer 42. In some embodiments, the second structural layer 42 includes a plurality of second protrusion structures 42P facing the display device 10. By way of example, the second protrusion structures 42P may include moth-eye structures protruding out from the second structural layer 42, and recessed structures such as valleys may be formed between adjacent moth-eye structures. In some embodiments, the refractive index of the second structural layer 42 is different from the refractive index of a medium interfacing the second structural layer 42. In some embodiments, the refractive index of the second structural layer 42 is greater than the refractive index of a medium. By way of example, the medium may include a gaseous medium such as air having a refractive index of about 1, and the second structural layer 42 may be formed from a transparent material such as organic or inorganic material having a refractive index of about 1.5, but not limited thereto. In some embodiments, the second protrusion structures 42P and the first protrusion structures 22P face each other. For example, the second protrusion structures 42P protrude toward the first anti-reflection layer 20, and the first protrusion structures 22P protrude toward the second anti-reflection layer 40.

Figure 5B:
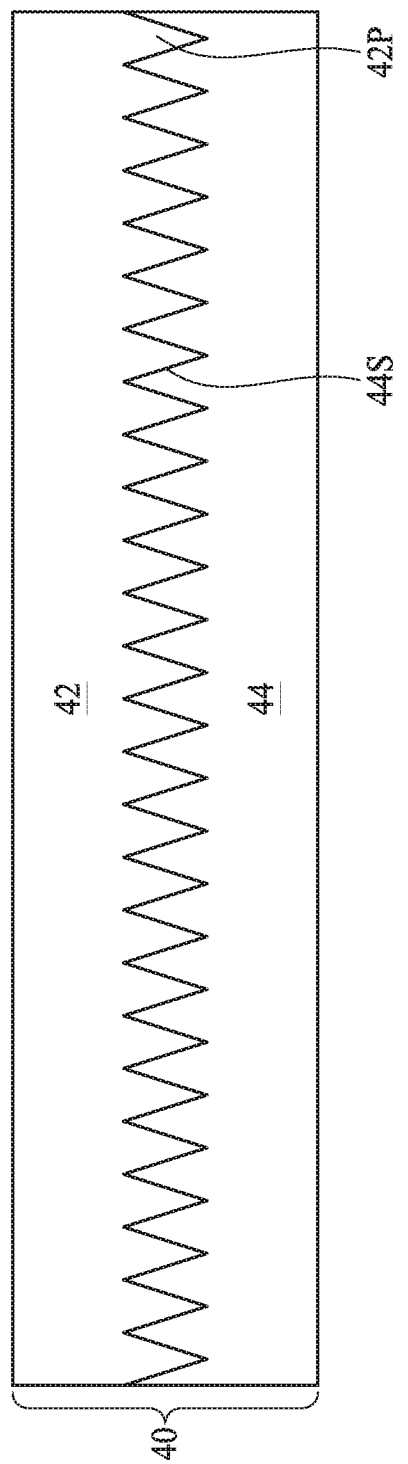
FIG. 5B is a schematic diagram of a second anti-reflection layer in accordance with some embodiments of the present disclosure.

FIG. 5B is a schematic diagram of a second anti-reflection layer in accordance with some embodiments of the present disclosure. As shown in FIG. 5B, the second anti-reflection layer 40 may further include a second optical layer 44 disposed over the second structural layer 42. In some embodiments, the second optical layer 44 is in contact with the second structural layer 42, and a surface 44S of the second optical layer 44 is engaged with the second protrusion structures 42P of the second structural layer 42. In some embodiments, the second structural layer 42 and the second optical layer 44 are formed from transparent materials such as organic or inorganic materials having different refractive indices. In some embodiments, the refractive index of the second optical layer 44 is smaller than the refractive index of the second structural layer 42. By way of example, the refractive index of the second optical layer 44 is about 1, and the refractive index of the second structural layer 42 is about 1.5, but not limited thereto. In some embodiments, the second protrusion structures 42P and the first protrusion structures 22P face each other. For example, the second protrusion structures 42P protrude toward the first anti-reflection layer 20, and the first protrusion structures 22P protrude toward the second anti-reflection layer 40.

Figure 6:
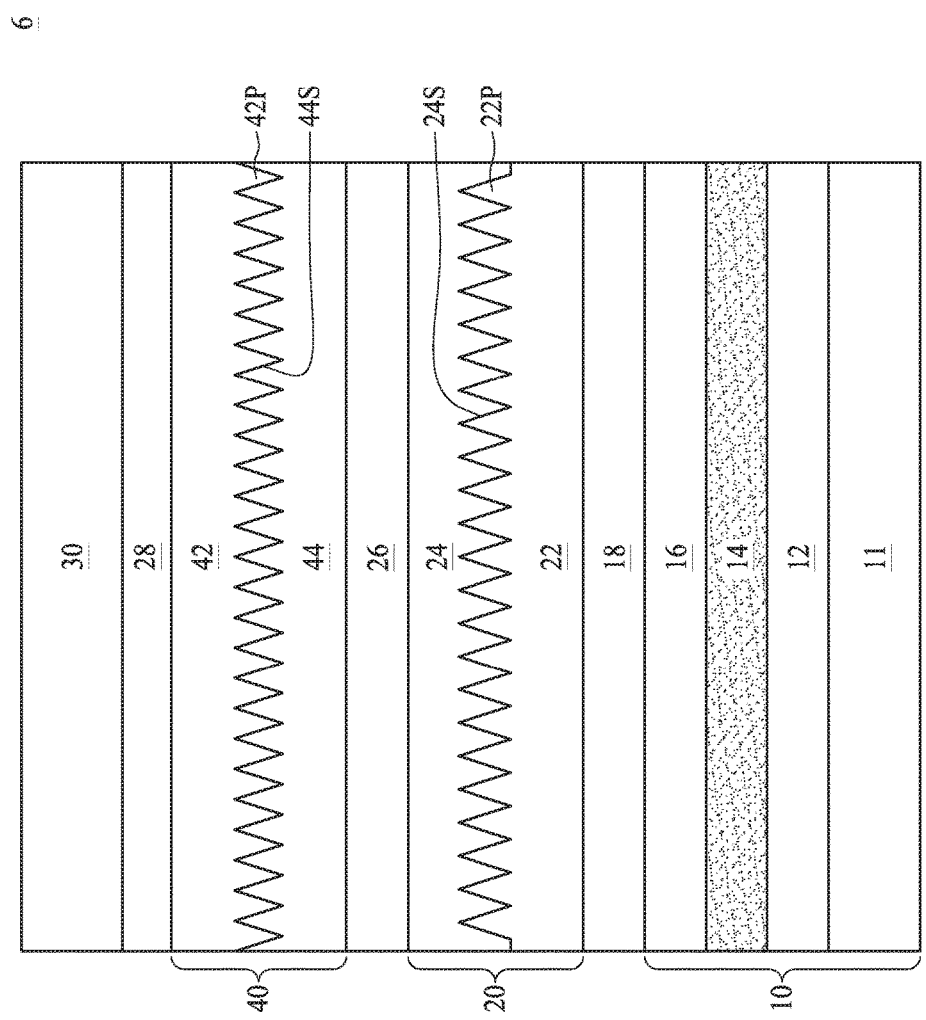
FIG. 6 is a schematic diagram of a display panel in accordance with some embodiments of the present disclosure.

FIG. 6 is a schematic diagram of a display panel in accordance with some embodiments of the present disclosure. As shown in FIG. 6, in contrast to the display panel 5 of FIG. 5, the display panel 6 may further include a touch input device 26 configured to provide touch input function. In some embodiments, the touch input device 26 may be disposed between the first anti-reflection layer 20 and the second anti-reflection layer 40. In some embodiments, the display panel 6 may further include a polarizer 28 configured to further reduce reflection of incident light. In some embodiments, the polarizer 28 is disposed between the second anti-reflection layer 40 and the cover layer 30. In some embodiments, the polarizer 28 may include a stack of a circular polarizing layer and a linear polarizing layer. In some embodiments, the circular polarizing layer is configured as a ¼ wavelength retardation layer.

Figure 7B:
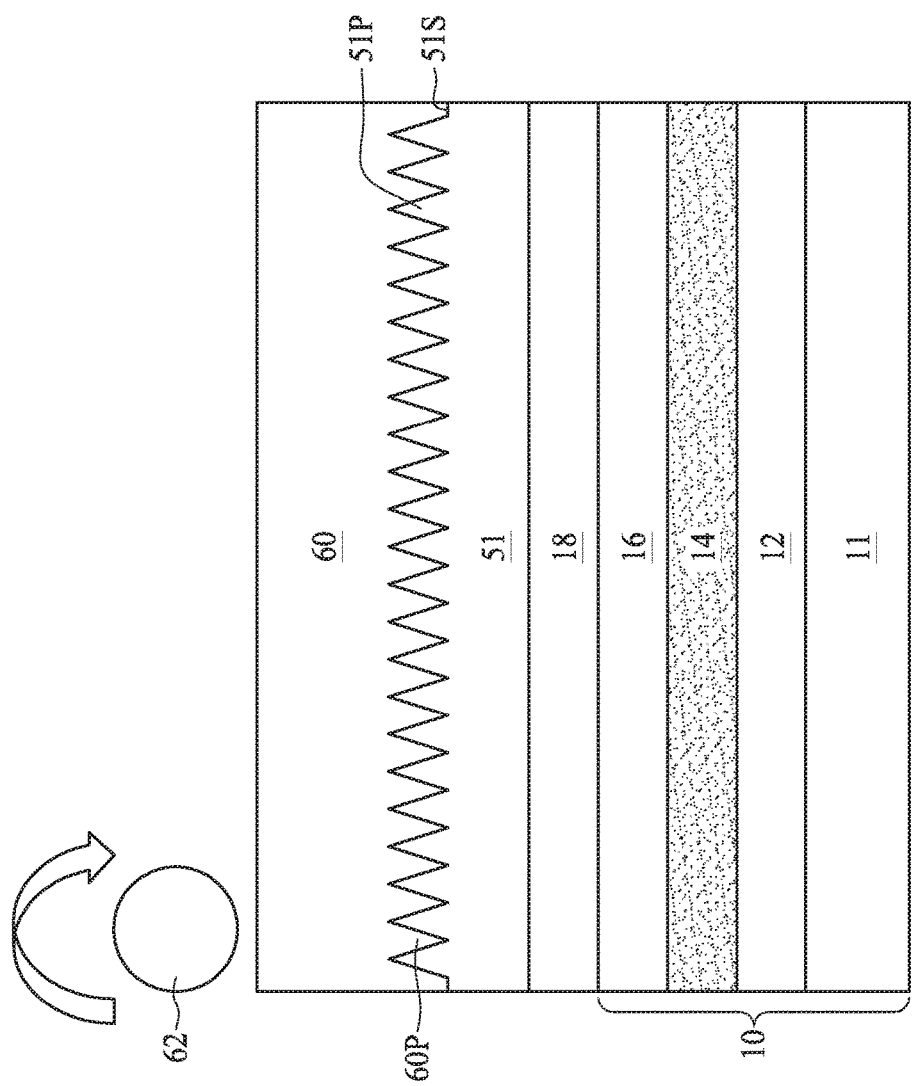

FIG. 7A, FIG. 7B, FIG. 7C, FIG. 7D and FIG. 7E are schematic diagrams illustrating a method for forming a display panel in accordance with some embodiments of the present disclosure. As shown in FIG. 7A, a display device 10 is formed. In some embodiments, the display device 10 may include a substrate 11, an anode 12, an organic light-emitting layer 14 and a cathode 16. In some embodiments, a thin film encapsulation (TFE) 18 may be optionally formed over the display device 10. Subsequently, a photo-sensitive material 51 is formed over the display device 10. In some embodiments, the photo-sensitive material 51 may include a UV curable resin. In some embodiments, the photo-sensitive material 51 may be formed over the display device 10 by coating such as spin coating, dispensing, printing or the like. In some embodiments, the photo-sensitive material 51 may be in a liquid form.

As shown in FIG. 7B, a mold 60 with nanostructures 60P is provided. In some embodiments, the mold 60 may include a stamper or the like. Then, a plurality of protrusion structures 51P is imprinted in a surface 51S of the photo-sensitive material 51 by the mold 60. In some embodiments, the imprinting operation may be implemented by roller imprinting using a roller 62.

Figure 7C:
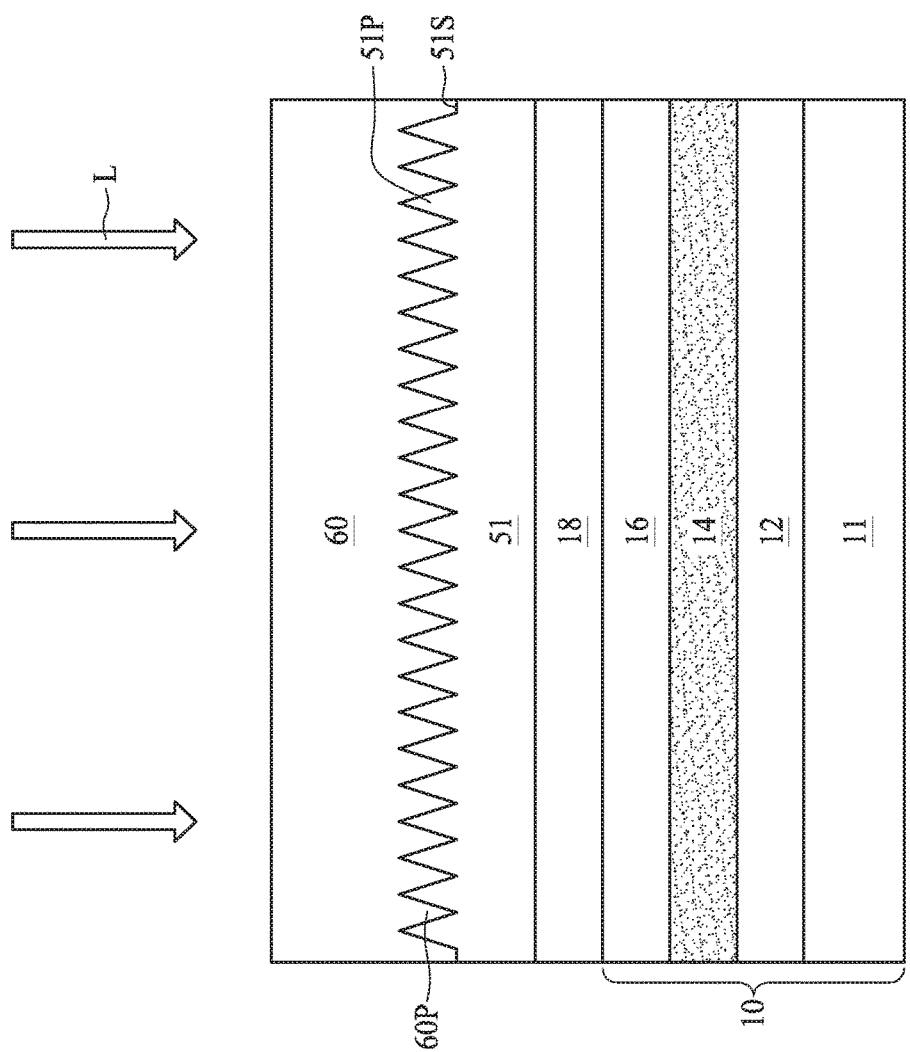

As shown in FIG. 7C, an exposure L such as a UV exposure may be performed to optically irradiate the photo-sensitive material 51 to cure the photo-sensitive material 51. In some embodiments, a thermal treatment such as a bake operation may be performed to solidify the photo-sensitive material 51.

Figure 7D:
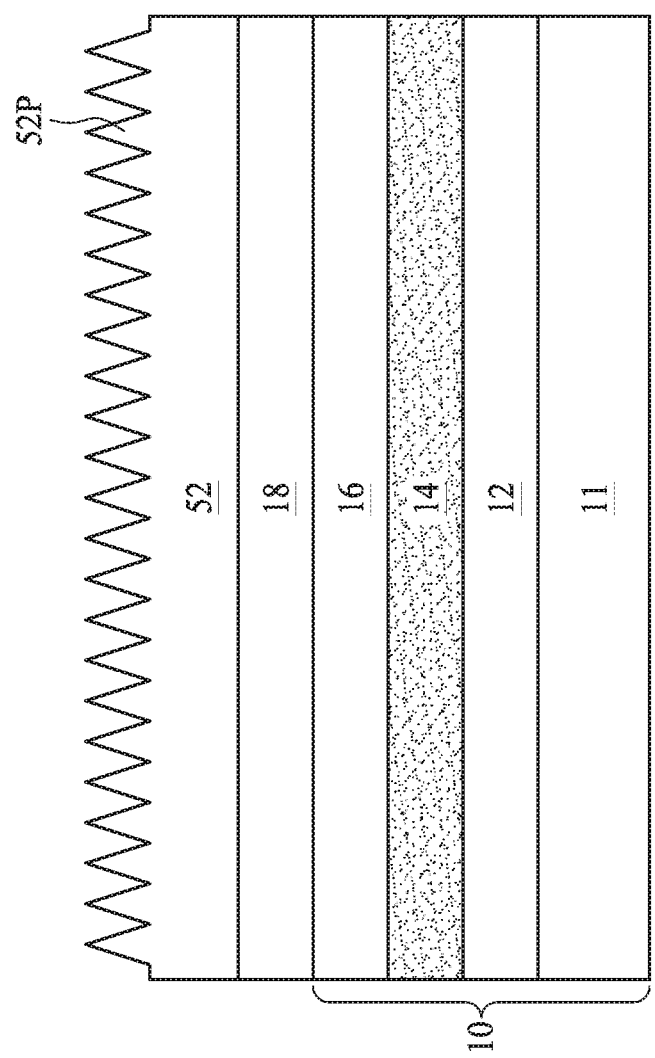

As shown in FIG. 7D, the mold 60 is removed from the protrusion structures after the photo-sensitive material 51 is cured to form an anti-reflection layer 52 having protrusion structures 52P.

Figure 7E:
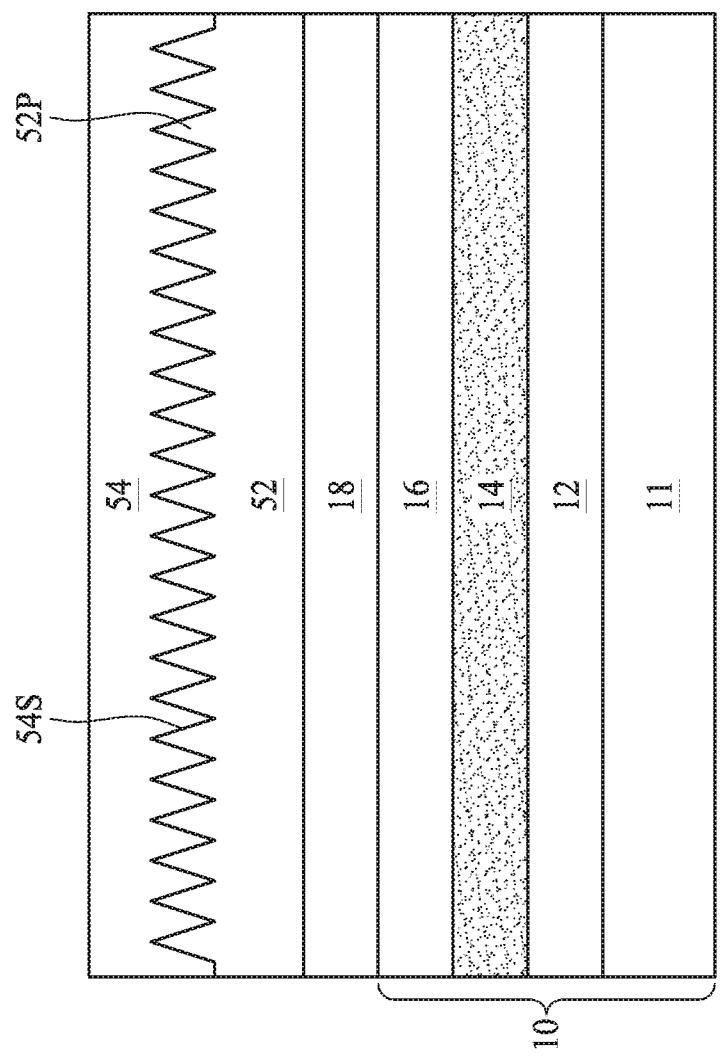

As shown in FIG. 7E, an optical layer 54 may be optionally formed over the anti-reflection layer 52. In some embodiments, the optical layer 54 is contact with the anti-reflection layer 52, and a surface 54S of the optical layer 54 is engaged with the protrusion structures 52P.

In some embodiments, both the first anti-reflection layer 20 and the second anti-reflection layer 40 as illustrated in FIGS. 1-6 can be directly fabricated on the display device 10 by the aforementioned method.

In some embodiments of the present disclosure, a display panel such as an OLED display panel is equipped with one or more integrally-formed anti-reflection layer. The integrally-formed anti-reflection layer can be directly formed on the display surface of the display panel without damaging the display device such as OLED device and without requiring additional adhesive layers, and thus can save manufacturing costs and minimize the overall thickness of the display panel. The integrally-formed anti-reflection layer can inhibit reflection of incident light from the environment, and thus can increase visibility and contrast ratio in outdoor use. The integrally-formed anti-reflection layer can also have high transmittance for the lights displayed by the display panel, and thus the brightness can be further enhanced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display panel, comprising:
a display device comprising a plurality of pixels;
a first anti-reflection layer over the pixels of the display device, wherein the first anti-reflection layer comprises a first structural layer including a plurality of first protrusion structures opposite to the display device, and a first optical layer in contact with the first structural layer, and a surface of the first optical layer is engaged with the first protrusion structures;
a cover layer over the first optical layer of the first anti-reflection layer; and
a second anti-reflection layer between the first anti-reflection layer and the cover layer, wherein the second anti-reflection layer comprises a second structural layer including a plurality of second protrusion structures facing the first anti-reflection layer.

2. The display panel of claim 1, wherein the display device comprises an organic light-emitting diode (OLED) device, and each of the pixels comprises an anode, an organic light-emitting layer over the anode, and a cathode over the organic light-emitting layer.

3. The display panel of claim 1, wherein a refractive index of the first optical layer is smaller than a refractive index of the first structural layer.

4. The display panel of claim 1, further comprising a thin film encapsulation between the display device and the first anti-reflection layer.

5. The display panel of claim 4, further comprising a touch input device between the thin film encapsulation and the cover layer.

6. The display panel of claim 5, further comprising a polarizer between the touch input device and the cover layer.

7. The display panel of claim 1, wherein the second anti-reflection layer further comprises a second optical layer in contact with the second structural layer, and a surface of the second optical layer is engaged with the second protrusion structures.

8. The display panel of claim 7, wherein a refractive index of the second optical layer is smaller than a refractive index of the second structural layer.

9. A display panel, comprising:
an organic light-emitting diode (OLED) device comprising a plurality of pixels for emitting lights, wherein each of the pixels comprises an anode, an organic light-emitting layer over the anode, and a cathode over the organic light-emitting layer;
a first anti-reflection layer over the cathodes of the pixels of the OLED device, wherein the first anti-reflection layer comprises a first structural layer including a plurality of first protrusion structures opposite to the cathode, and a first optical layer in contact with the first structural layer, and a surface of the first optical layer is engaged with the first protrusion structures, and wherein the first anti-reflection layer is configured to inhibit reflection of incident lights and to pass the lights emitted from the pixels, and a transmittance of the first anti-reflection layer for the lights emitted from the pixels is greater than 50%; and
a second anti-reflection layer over the first anti-reflection layer, wherein the second anti-reflection layer is configured to inhibit reflection of incident lights and to pass the lights emitted from the pixels, and a transmittance of the second anti-reflection layer for the lights emitted from the pixels is greater than 50%.

10. The display panel of claim 9, wherein a refractive index of the first optical layer is smaller than a refractive index of the first structural layer.

11. The display panel of claim 9, wherein the second anti-reflection layer comprises a second structural layer including a plurality of second protrusion structures facing the first anti-reflection layer.

12. The display panel of claim 11, wherein the second anti-reflection layer further comprises a second optical layer in contact with the second structural layer, and a surface of the second optical layer is engaged with the second protrusion structures.

13. The display panel of claim 12, wherein a refractive index of the second optical layer is smaller than a refractive index of the second structural layer.

14. A method for manufacturing a display panel, comprising:
forming a display device;
forming a photo-sensitive material over the display device;
imprinting a plurality of protrusion structures in a surface of the photo-sensitive material with a mold;
optically irradiating the photo-sensitive material;
removing the mold from the photo-sensitive material to form an anti-reflection layer having the plurality of protrusion structures;
forming an optical layer over the protrusion structures, wherein the optical layer is in contact with and engaged with the protrusion structures; and
forming a second anti-reflection layer comprising a second structural layer including a plurality of second protrusion structures facing the anti-reflection layer, and a second optical layer in contact with and engaged with the second protrusion structures.

* * * * *